United States Patent
Liu et al.

(10) Patent No.: US 11,318,506 B2
(45) Date of Patent: May 3, 2022

(54) APPARATUS FOR CLEANING SEMICONDUCTOR EQUIPMENT

(71) Applicant: TAIWAN SEMICONDUCTOR MANUFACTURING COMPANY LTD., Hsinchu (TW)

(72) Inventors: Shih-Kuo Liu, Nantou County (TW); Chia-Hsun Chang, Changhua County (TW); Keith Kuang-Kuo Koai, Hsinchu County (TW); Wai Hong Cheah, Taichung (TW); Ming-Chuan Hung, Changhua County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 236 days.

(21) Appl. No.: 16/442,393

(22) Filed: Jun. 14, 2019

(65) Prior Publication Data

US 2020/0055102 A1    Feb. 20, 2020

Related U.S. Application Data

(60) Provisional application No. 62/497,351, filed on Aug. 16, 2018.

(51) Int. Cl.
| | | |
|---|---|---|
| *B08B 9/08* | (2006.01) | |
| *B08B 15/00* | (2006.01) | |
| *B08B 1/04* | (2006.01) | |
| *B08B 9/087* | (2006.01) | |

(52) U.S. Cl.
CPC .............. *B08B 9/0813* (2013.01); *B08B 1/04* (2013.01); *B08B 9/087* (2013.01); *B08B 15/007* (2013.01)

(58) Field of Classification Search
CPC ....... H01L 21/02041–02101; H01L 21/67051; A46B 13/02
See application file for complete search history.

(56) References Cited

U.S. PATENT DOCUMENTS

| | | | |
|---|---|---|---|
| 6,285,919 B1 * | 9/2001 | Randolph | B08B 9/08 700/245 |
| 8,720,456 B2 * | 5/2014 | Miyanari | H01L 21/67028 134/186 |
| 9,468,957 B1 * | 10/2016 | Al Shammari | B08B 9/087 |

(Continued)

FOREIGN PATENT DOCUMENTS

| | | | |
|---|---|---|---|
| CN | 106670149 A | * | 5/2017 |
| CN | 107199189 A | * | 9/2017 |

(Continued)

*Primary Examiner* — Spencer E. Bell
*Assistant Examiner* — Omair Chaudhri
(74) *Attorney, Agent, or Firm* — WPAT, P.C. Intellectual Property Attorneys; Anthony King

(57) ABSTRACT

An apparatus includes a first support member coupled to a casing and constructed to move along a first axis through the casing and rotate around the first axis, a second support member coupled to the first support member and constructed to move along a second axis perpendicular to the first axis, and an arm pivotally coupled to the second support member and constructed to rotate around a third axis perpendicular to the first axis and the second axis. The apparatus also includes a cleaning head attached to the arm and constructed to rotate around a longitudinal axis of the arm.

20 Claims, 6 Drawing Sheets

(56) References Cited

U.S. PATENT DOCUMENTS

| | | | |
|---|---|---|---|
| 2003/0102015 A1* | 6/2003 | Halbmaier | H01L 21/67051 134/30 |
| 2007/0181153 A1* | 8/2007 | Kobayashi | B08B 3/02 134/6 |
| 2007/0226925 A1* | 10/2007 | Hiraoka | H01L 21/67046 15/102 |
| 2009/0241989 A1* | 10/2009 | MacNeil | A46B 13/008 134/6 |
| 2013/0092193 A1* | 4/2013 | Porat | E04H 4/1654 134/22.1 |
| 2013/0174876 A1* | 7/2013 | Greenwood | B08B 9/0936 134/24 |
| 2013/0233359 A1* | 9/2013 | Meissner | B08B 3/02 134/134 |
| 2016/0271658 A1* | 9/2016 | Rebstock | H01L 21/67051 |
| 2017/0347788 A1* | 12/2017 | Outa | A46B 13/02 |
| 2018/0104728 A1* | 4/2018 | DesOrmeaux | B08B 9/0936 |

FOREIGN PATENT DOCUMENTS

| | | | | |
|---|---|---|---|---|
| CN | 107891045 A | * | 4/2018 | |
| EP | 0114424 A2 | * | 8/1984 | B08B 3/02 |

\* cited by examiner

APPARATUS FOR CLEANING SEMICONDUCTOR EQUIPMENT

PRIORITY CLAIM AND CROSS-REFERENCE

This application claims priority to U.S. Provisional Application No. 62/497,351 filed Aug. 16, 2018, the disclosure of which is hereby incorporated by reference in its entirety.

BACKGROUND

In advanced semiconductor technologies, the continuing reduction in device size and increasingly complicated circuit arrangements have made the fabrication of integrated circuits (ICs) more challenging and costly. A finished semiconductor device may undergo hundreds of operation steps, such as etching, deposition and implantation, in various processing chambers. The processing conditions and reaction recipes for each operation step should be well managed to ensure that the physical and electrical performance of the finalized devices conforms to design specifications. Therefore, the operation and maintenance of the processing chambers play an important role for obtaining desirable semiconductor devices.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
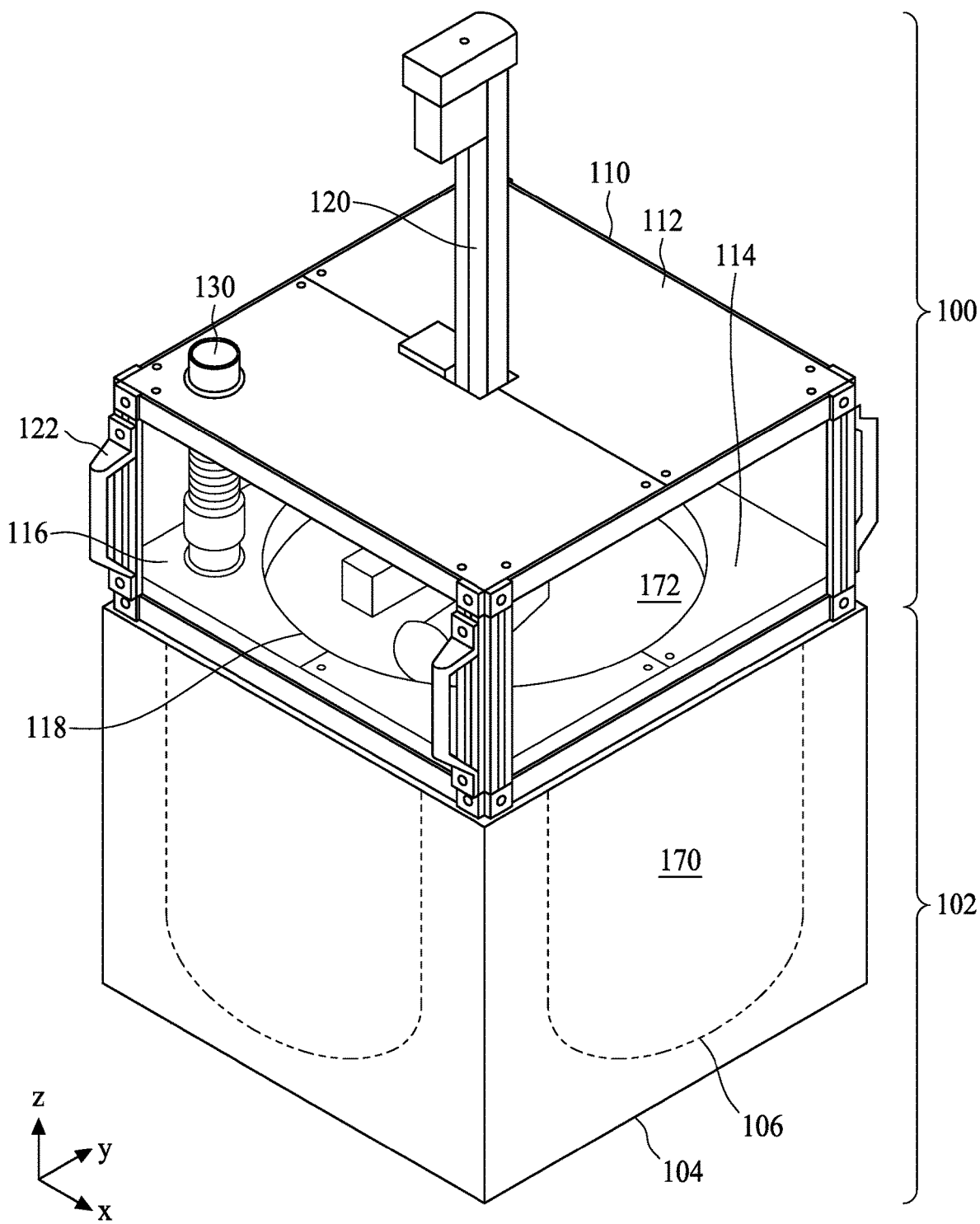
FIG. 1A is a schematic diagram illustrating a cleaning apparatus for a semiconductor equipment in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The semiconductor equipment is an essential component to the process of successfully fabricating a semiconductor device conforming to the predetermined specifications. The cost and time of maintaining the semiconductor equipment is crucial for effective production operations since efficient maintenance of semiconductor equipment can reduce downtime and improve the production yield. A routine cleaning duty for a processing chamber is required between consecutive operation steps for different processed wafers or for same wafer with different processing recipes in order to restore the processing environment to its initial contamination-free status. At a minimum, the cleaning operation removes unexpected materials left in the processing chambers. The main tasks of cleaning focus on removal of residual processing materials on the processing chamber wall or other parts of the semiconductor equipment after a processing step is completed. If the processing chamber is not cleaned well, the materials may remain adhered to the processing chamber, resulting in a contaminated environment for subsequent processing steps.

Unlike most of the fully-autonomous or semi-autonomous fabrication steps performed during the manufacturing of semiconductor devices, the cleaning of processing chambers is usually performed almost completely by hand due to the delicate and complex configuration of the semiconductor equipment. Such cleaning work is labor intensive and time consuming, and the cleaning personnel may be exposed to toxic processing materials. Although the cleaning personnel are equipped with isolation gowns and masks throughout the process of the cleaning operation, the safety issue is still a concern. Furthermore, it has long been desired to increase the efficiency of the cleaning procedure in order to increase the uptime of the semiconductor equipment.

To address the abovementioned needs, the present disclosure discusses an apparatus for cleaning semiconductor equipment. The proposed apparatus is equipped with a quasi-sealed casing along with which a cleaning robot is provided such that the cleaning procedure can be accomplished autonomously in a controlled, isolated environment. The waste materials, such as toxic gas or waste liquid, are vented or collected through isolated channels, thereby preventing the operation room from being contaminated. Moreover, the cleaning robot is configured to move along multiple directions for helping a cleaning head on the terminal of the robot to move freely along the walls of the processing chamber. The cleaning head is configured to scrub the adhered processing materials off the processing chamber wall. It has been shown that the cleaning apparatus can perform most of the conventional manual cleaning duties and can save a great deal of manpower and cleaning time. The manufacturing throughput and cost are improved accordingly. Moreover, the health and safety of the factory employees are enhanced.

FIG. 1A is a schematic diagram illustrating a cleaning apparatus 100 for a semiconductor equipment 102 in accordance with some embodiments. The cleaning apparatus 100 is standalone and may be disposed on a carrier (not shown), such as a trolley, when the cleaning apparatus 100 is not used. When a cleaning request is activated, the cleaning apparatus 102 is moved from the carrier and mounted on the semiconductor equipment 102. In an embodiment, the semiconductor equipment 102 is used for performing a semiconductor processing or treatment step, such as etching, deposition, implantation, and oxidation. In an embodiment, the semiconductor equipment 102 has a body 104 accommodating a processing chamber 172 within which one or more wafers can be processed. The processing chamber 172, as illustrated with dotted lines in FIG. 1A, has a chamber wall 106. In an embodiment, the chamber 172 has an opening on an upper side. In addition, the semiconductor equipment 102 may include openings and/or channels formed on lateral sides and configured to transfer reacting materials, such as reacting gas and liquid. In an embodiment, a wafer holder or chuck may be used to hold a wafer to be processed and to transport the wafer into the chamber 172 through the openings or channels in the body 104. In an embodiment, the body 104 has a polygonal shape from a top-view perspective, such as a quadrilateral shape, although other shapes, such as a circular shape, may be possible.

The cleaning apparatus 100 includes a casing 110 disposed over the semiconductor equipment 102. The casing 110, along with the body 104 of the semiconductor equipment 102, forms a sealed space 172 including the processing chamber 170 of the semiconductor equipment 102. In an embodiment, the casing 110 is constructed like a hood to cover the processing chamber 170 from the top surface of the processing chamber 170. In an embodiment, the casing 110 includes a top plate 112, a bottom plate 114 and one or more side plates 116. In an embodiment, the top plate 112 and the bottom plate 114 are parallel to each other and are parallel to a top surface of the semiconductor equipment 102. The bottom plate 114 includes an opening 118 at a central location that faces the processing chamber 170 of the semiconductor equipment 102. In an embodiment, the opening 118 of the bottom plate 114 has a diameter approximately equal to that of to the opening of the chamber 170. A cleaning robot (to be explained in greater detail below) is mounted on the casing 110 and allowed to move in the sealed space 172 through the opening 118 of the bottom plate 114 and clean the chamber wall (e.g., the chamber wall 106 in FIG. 1B) of the semiconductor equipment 102. In an embodiment, the top plate 112 and the bottom plate 114 are formed of rigid materials, such as metal or plastic. In an embodiment, a sealing strip formed of flexible materials, such as epoxy, is disposed on of the bottom plate 114 such that the gap between the casing 110 and the semiconductor equipment 102 is eliminated.

In an embodiment, the side plates 116 are connected to the top plate 112 and the bottom plate 114 for establishing the sealed space 172. In an embodiment, the side plates 116 are substantially perpendicular to the top plate 112 or the bottom plate 114. Each of the side plates 116 may have a rectangular shape and may be connected to the respective sides of the top plate 112 or the bottom plate 114. In an embodiment, a handle 122 is disposed on at least one side plate 116 for the convenience of carrying the cleaning apparatus 100. In an embodiment, each of the side plates 116 further includes a frame and a panel embedded within the frame. The frame may be formed of metal or plastic, and the panel may be formed of plastic or glass. The panels of the side plates 116 may be formed of transparent or opaque materials.

Figure 1B:
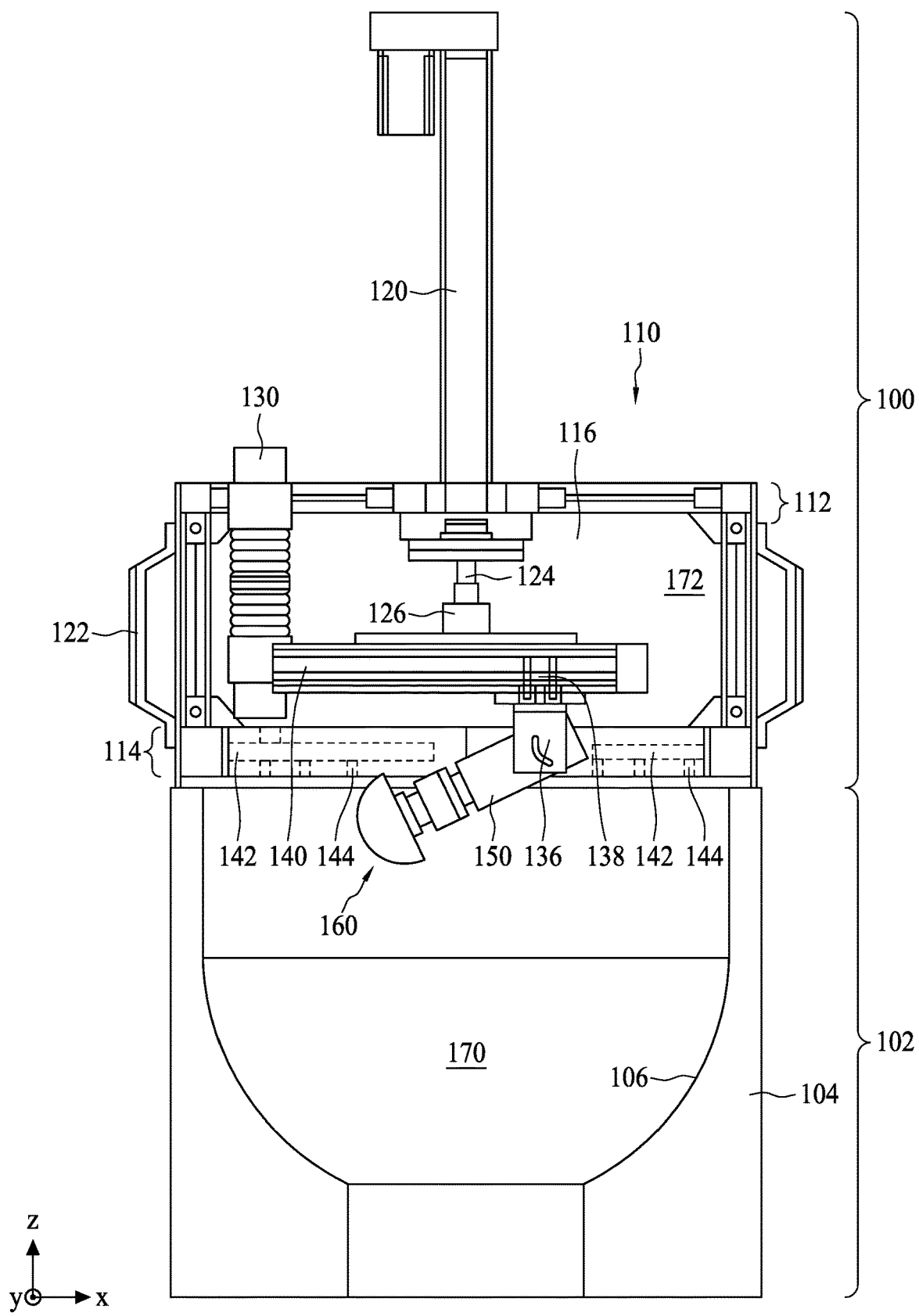
FIG. 1B is a schematic perspective view of the cleaning apparatus in FIG. 1A, in accordance with some embodiments.

FIG. 1B is a schematic diagram of the cleaning apparatus 100 in FIG. 1A from a lateral-view perspective, in accordance with some embodiments. Referring to FIG. 1A and FIG. 1B, the opening of the processing chamber 170 faces the opening 118 of the bottom plate 114. In an embodiment, the side plates 116 extend along the surface of the chamber wall 106. In an embodiment, the inner edges of the side plates 116 are aligned with the chamber wall 106. In an embodiment, the outer edges of the side plates 116 are aligned with or covering the outer sidewall of the body 104.

Referring to FIG. 1A and FIG. 1B, the robot of the cleaning apparatus 100 includes support members constructed by a cylinder 120, a rail 140, a connector 138 and an arm 150. The robot further includes a cleaning head 160 coupled to the arm 150. The support members of the robot in the cleaning apparatus 100 are constructed to hold the cleaning head 160 such that the cleaning head can move within the processing chamber 170 and make contact with the chamber wall 106 to perform cleaning.

In an embodiment, the cylinder 120 is attached to the top plate 112 of the casing 110 and protrudes from the top plate 112. The cylinder 120 includes an embedded movable shaft 124 extending through the casing 110. The movable shaft 124 is configured to move along the z-axis substantially perpendicular to the surface of the top plate 112 or the bottom plate 114. In an embodiment, the movable shaft 124 includes telescopic sleeves that can expand or contract in the sealed space 172. In an embodiment, the cylinder 120 further includes a rotary unit 126 coupled to the movable shaft 124. The rotary unit 126 can rotate around the axis (e.g., the z-axis) of the movable shaft 124. In an embodiment, the movable shaft 124 is configured to rotate around its axis with the rotary unit 126 serving as a terminal part of the movable shaft 124.

The rail 140 is coupled to the cylinder 120 via the movable shaft 124. In an embodiment, the rail 140 extends horizontally on the x-y plane. In the present embodiment, the rail 140 extends along the x-axis. In an embodiment, the rail 140 is configured to move up and down along with the vertical movement of the movable shaft 124. Furthermore, the rail 140 is configured to rotate along with the rotation of the movable shaft 124 or the rotary unit 126. Therefore, the rail 140 can move up and down in the z-axis and rotate horizontally in the x-y plane freely in the sealed space 172. The rail 140 is further coupled to the arm 150 through the connector 138. In an embodiment, the connector 138 is configured as a movable connector to move on the rail 140. In an embodiment, the rail 140 is a slide rail that allows the connector 138 to be clamped onto the rail 140 and move in a trench or track of the rail 140 along the axis of the rail 140. In an embodiment, the rail 140 is formed long enough for the cleaning head 160 to reach any portion of the chamber wall 106 as desired, but the rail 140 should not be made arbitrarily long so as to ensure that the cleaning apparatus 100 can be accommodated in processing chambers 170 having small chamber diameters.

In an embodiment, the cleaning apparatus 100 includes a driving member, such as a motor, configured to drive the connector 138. In an embodiment, the rail 140 includes pulleys or belts configured to pull or drive the connector 138. In an embodiment, the connector 138 includes an end that extends towards the processing chamber 170. The connector 138 further includes a pivot 136 through which the connector 138 is pivotally coupled to the arm 150. In an embodiment, the arm 150 is configured to rotate around a center of the pivot 136. For example, as shown in the present embodiment, the center of the pivot 136 extends in a direction of the y-axis, and thereby the arm 150 rotates in the x-z plane around the y-axis. However, when the connector 138 is rotated along with the rotation of the rail 140 via the rotation of the movable shaft 124 (or the rotary unit 126), the center axis of the pivot 136 will point in different directions, and thus the arm 150 is able to point to different vertical locations (towards either the upper, central or the lower portion) as well as in different horizontal orientations of the chamber wall 106.

In an embodiment, the arm 150 cooperates with the rail 140, the connector 138 and the movable shaft 124 to control the location and orientation of the cleaning head 160. For example, the vertically-moving shaft 124 and the rotation angle of the arm 150 cooperatively determine the vertical position of the cleaning head 160 along the z-axis, while a combined horizontal motion of the rail 140, the rotating shaft 124 (or rotary unit 126), the connector 138 and the rotation angle of the arm 150 cooperatively determine the horizontal position of the cleaning head 160. In some embodiments, the arm 150 and the support members comprised of the movable shaft 124, the rotary unit 126, the rail 140 and the connector 138 may cooperatively provide different combinations of connection angles and locations while still achieving a similar effect of having the cleaning head 160 contact a same location on the chamber wall 106. In an embodiment, the cleaning head 160 is configured such that the cleaning head 160 and the chamber wall 106 come into contact with the cleaning head 160 oriented perpendicular to the chamber wall 106, or the cleaning head can be oriented at any other suitable contact angle for facilitating the application of cleaning force.

In an embodiment, referring to FIGS. 1A and 1B, the cleaning apparatus 100 includes a tube 130 protruding from the top plate 112. In an embodiment, the tube 130 is coupled to the bottom plate 114. The tube 130 is configured as a channel to transport cleaning gas or liquid to the processing chamber 170 of the semiconductor equipment 102 through the bottom plate 114. In an embodiment, the cleaning gas or liquid includes deionized water or other cleaning solvent.

In an embodiment, as shown in FIG. 1B, the cleaning apparatus 100 further includes a channel 142 within the bottom plate 114. In an embodiment, the channel 142 is formed as a hollow space within the bottom plate 114. In an embodiment, the channel 142 is coupled to the tube 130. In an embodiment, the channel 142 is configured to transport cleaning gas or cleaning liquid in conjunction with the tube 130. The channel 142 may extend horizontally along the direction of the surface of the bottom plate 114. In an embodiment, the channel 142 is disposed on a periphery of the bottom plate 114. In an embodiment, the bottom plate 114 further includes several vias 144 coupled to the channel 142. The vias 144 face the processing chamber 170 and are configured to spray the cleaning gas or liquid. In an embodiment, a nozzle (not separately shown) is disposed at the end of each of the vias 144 and the nozzle is configured to control the spraying direction of the cleaning gas or liquid.

Figure 2A:
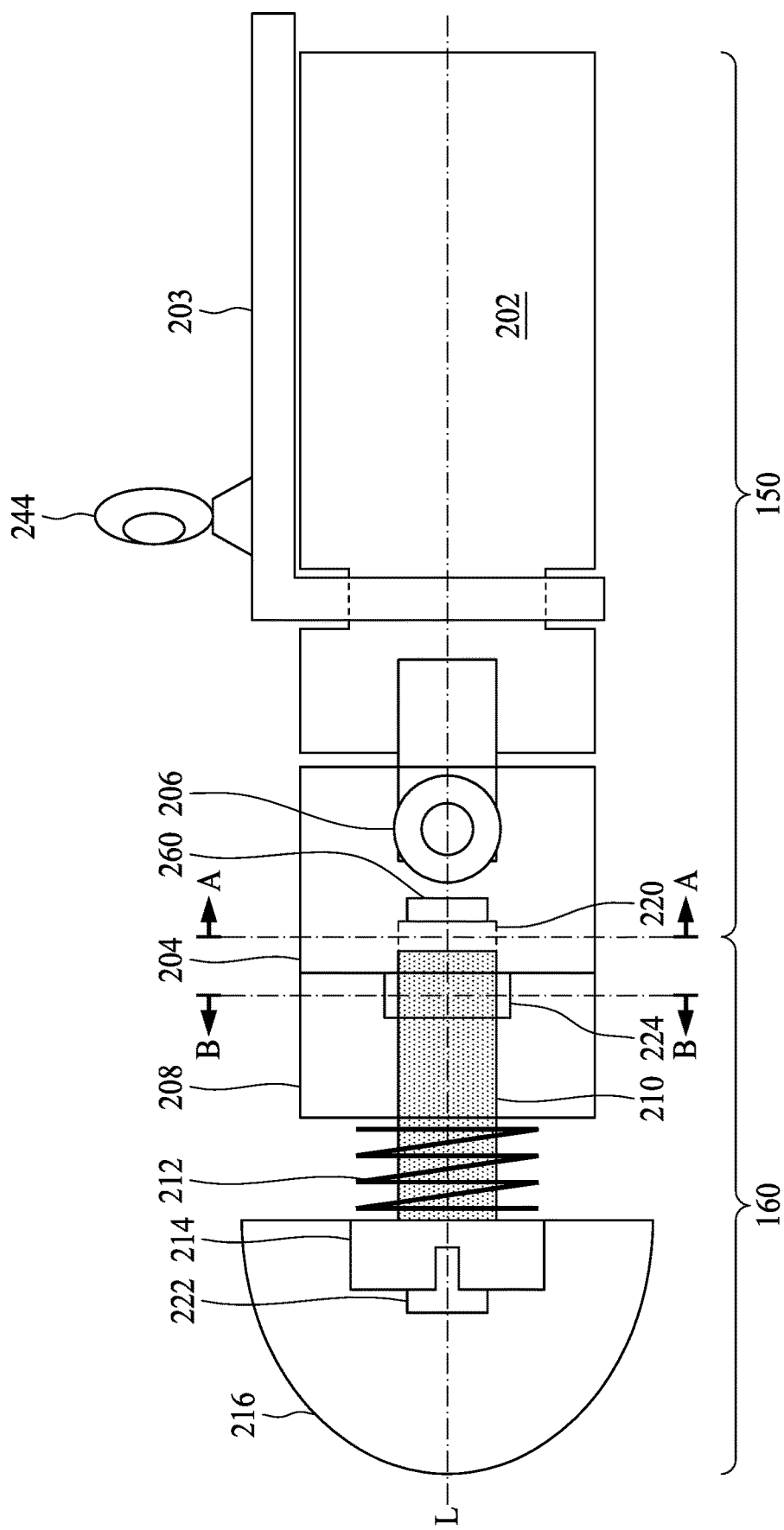
FIG. 2A is an enlarged view of a robot of the cleaning apparatus in FIG. 1A, in accordance with some embodiments.

FIG. 2A is a schematic diagram of the arm 150 and the cleaning head 160 of the cleaning apparatus 100 in FIG. 1A, in accordance with some embodiments. The arm 150 has a first end coupled to the pivot 136 of the connector 138 and a second end coupled to the cleaning head 160. The arm 150 includes a driving member 202 and a first sleeve 204. In an embodiment, the arm 150 further includes a holding member 203 coupled to the pivot 136. The holding member 203 may include a hole configured to hold the driving member 202 and allow the driving member 202 to rotate. In an embodiment, the driving member 202 is configured to rotate around the longitudinal axis L of the arm 150. In an embodiment, the driving member 202 includes a motor for supplying driving power of rotation. The first sleeve 204 is coupled to the driving member 202 and configured to rotate along with the driving member 202. In an embodiment, a fastening member 206, such as a clamp or a screw, is used to fasten the first sleeve with the driving member 202.

Figure 2C:
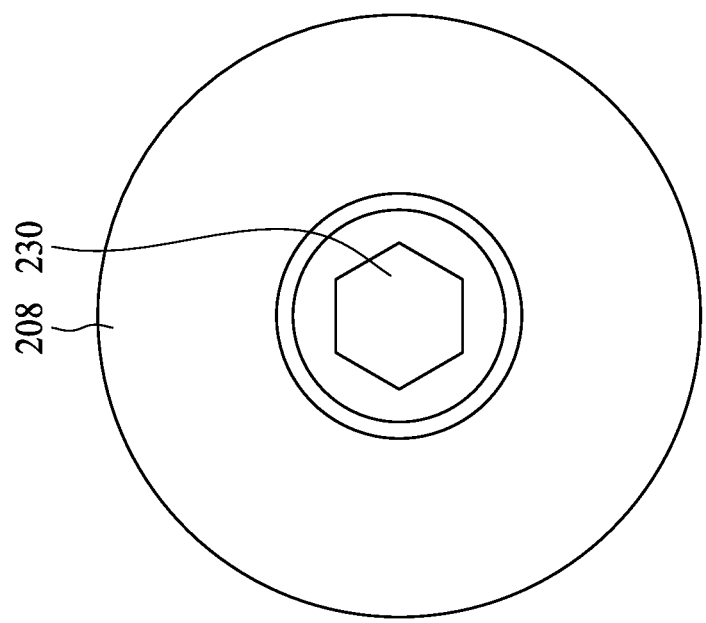
FIGS. 2B and 2C are schematic diagrams illustrating cross-sectional views of the arm and the cleaning head, respectively, in FIG. 2A, in accordance with some embodiments.
Figure 2B:
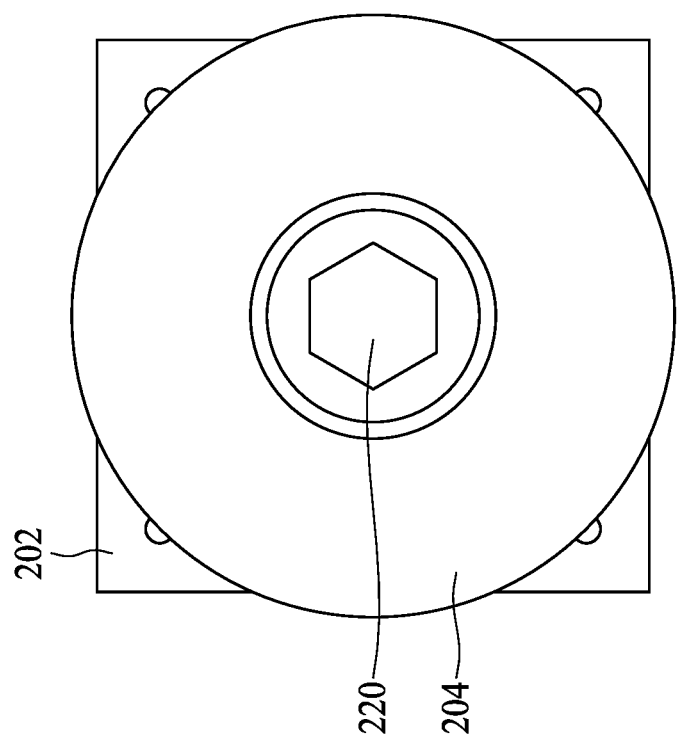

The cleaning head 160 includes a second sleeve 208 and a movable shaft 210. The second sleeve 208 is fastened to the first sleeve 204, e.g., through a bonding member, a glue or a fastening member, such as a clamp or a screw. In an embodiment, the second sleeve 208 is formed integrally with the first sleeve 204. The first sleeve 204 and the second sleeve 208 have holes (e.g., the holes 220 and 230 in FIGS. 2B and 2C) around their respective centers. Referring to FIGS. 2B and 2C, schematic cross-sectional diagrams of the first sleeve 204 and the second sleeve 208 are shown. The cross-sectional views of FIGS. 2B and 2C are taken along sectional lines AA and BB, respectively, in FIG. 2A. The hole 220 of the first sleeve 204 corresponds to the hole 230 of the second sleeve 208, and the holes 220 and 230 form a channel for the movable shaft 210 to move. As illustrated in FIGS. 2A and 2B, the hole 220 extends from a surface facing the second sleeve 208 and the hole 220 has a depth in the first sleeve 204. The hole 230 of the second sleeve 208 may run through the second sleeve 208 as shown in FIGS. 2A and 2B. Therefore, the movable shaft 210 can move along the longitudinal axis L of the arm 150 or the cleaning head 160 and stop at a depth of the first sleeve 204 when the cleaning head 160 contracts inwardly.

In an embodiment, the holes 220 and 230 are similar in shape and size. In an embodiment, the holes 220 and 230 have a polygonal shape, such as triangle, quadrilateral, pentagon, hexagon and the like. To match the shape of the holes 220 and 230, the movable shape 210 also has a polygonal shape as seen in its cross-sectional view, such as triangle, quadrilateral, pentagon, hexagon and the like. As compared to a circular shape, a polygonal shape of the holes 20 and 230 and the movable shaft 210 makes it easier to drive the movable shaft 210 to rotate by the rotation of first sleeve 204 or the second sleeve 208 without slipping. As a result, the cleaning head 160 can spin and thereby provide scrubbing force through the rotation force. In other words, the cleaning force is initially generated by the driving member 202 of the arm 150 and transported via the inter-linkage between the first sleeve 204, the second sleeve 208 and the movable shaft 210. Therefore, the cleaning head 160 can extend towards the chamber wall 106 until it comes into contact with the chamber wall 106. The cleaning head 160 further spins when contacting the chamber wall 106 and thereby scrubs the undesirable residues off the chamber wall 106 using the spinning force. Moreover, when there is insufficient distance between the cleaning head 160 and the chamber wall 106, the cleaning head 160 will go backwards through the contraction of the movable shaft 210 in order to maintain a suitable contact angle.

Referring back to FIG. 2A, the cleaning head 160 further includes a terminal 214 coupled to the movable shaft 210. The terminal 214 is configured to hold a cleaning material 216 for performing cleaning. In an embodiment, the terminal 214 is constructed as an end of the movable shaft 210. The terminal 214 may include a bar shape, a plate shape or the like. The terminal 214 may extend in a direction different from the longitudinal axis of the movable shaft 210. In an embodiment, the terminal 214 and the movable shaft 214 constitute a T-shape structure or an opened umbrella shape. In an embodiment, the cleaning material 216 includes cloth or scrubbing sponge and may be formed of polyester, polyurethane or the like. The cleaning material may also include abrasives for enhancing the cleaning performance. In an embodiment, the cleaning material 216 has a spherical shape, a semispherical shape, a bar shape, or other suitable shape. In an embodiment, a fastening member 222 is used to fasten the cleaning material 216 to the terminal 214. In an embodiment, the fastening member 222 is a screw, a clamp, a bolt or the like.

In an embodiment, the cleaning head 160 includes a cushion member 212 between the second sleeve 208 and the terminal 214. The cushion member 212 is utilized to provide buffering force for the terminal 214 to prevent the terminal 214 from forcibly bouncing back from the chamber wall 106 and damaging the second sleeve 208. In an embodiment, the cushion member 212 is a spring, a flexible material such as rubber, or the like. In an embodiment, the cushion member 212 surrounds or wraps around the movable shaft 210.

Figure 2D:
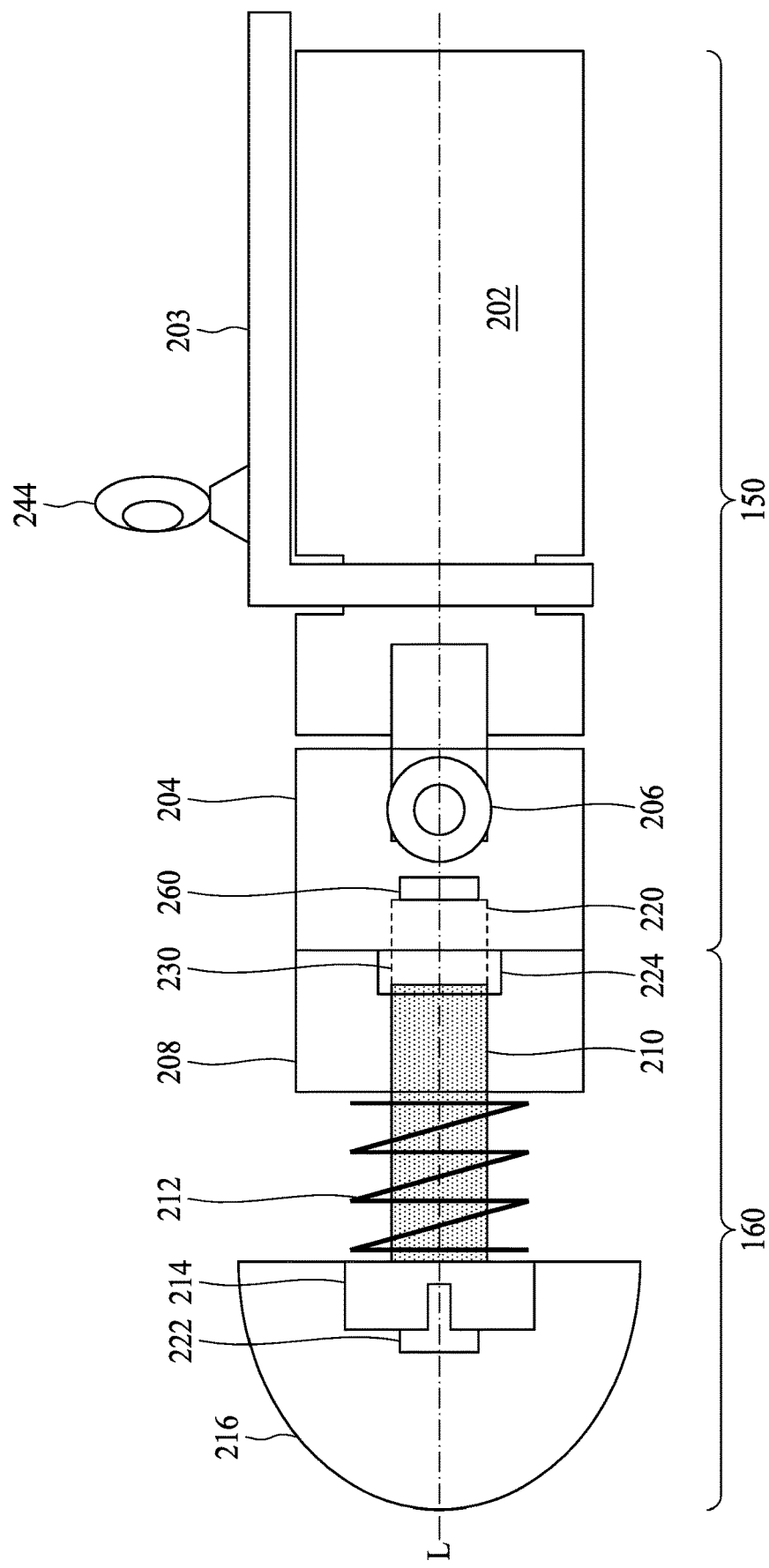
FIG. 2D is an enlarged view of a robot of the cleaning apparatus in FIG. 1A, in accordance with some embodiments.

In an embodiment, the cleaning head 160 further includes a holding member 224 coupled to the movable shaft 210. The holding member 224 is constructed to keep the movable shaft 210 from falling out of the cleaning head 160. FIG. 2D is a schematic diagram of the arm 150 and the cleaning head 160 of the cleaning apparatus 100 in FIG. 1A, in accordance with some embodiments. Referring to FIG. 2D, the holding member 224 is disposed on one end of the second sleeve 208 and holds the movable shaft 210. When the movable shaft 210 extends outwardly, the movable shaft 210 will be stopped by the holding member 224, and thus the maximal extension length of the movable shaft 210 is determined by the holding member 224. In an embodiment, the holding member 224 is a retaining ring, a clamp or the like.

In an embodiment, the cleaning operation is executed by software routines. In an embodiment, the robot and the cleaning head are operated manually or using mixed manual and automated operations. In an embodiment, the cleaning apparatus includes an imaging device 244 disposed on the robot of the cleaning apparatus, such as the arm 150, or the cleaning head 160. It is understood that the visual inspection is important in examining the cleaning performance. The knowledge of the cleaning personnel can help improve the automated cleaning operation through real-time inspection.

Referring to FIG. 2A and FIG. 2D, a pressure sensor 260 is disposed in the first sleeve 204. In some embodiments, the pressure sensor 260 is disposed in the hole 220 or in another location adjacent to the movable shaft 210. The pressure sensor 260 is configured to measure the pressure level applied by the chamber wall 106 on the cleaning head 160. In an embodiment, the pressure measurements can help determine whether the current location of the cleaning head 160 is suitable. For example, if the pressure measurements provided by the pressure sensor 260 are too high, such measurements indicate a high pressure engagement between the cleaning head 160 and the chamber wall 106, the cleaning apparatus 100 will respond by changing the robot orientation into a better cleaning position.

Figure 3:
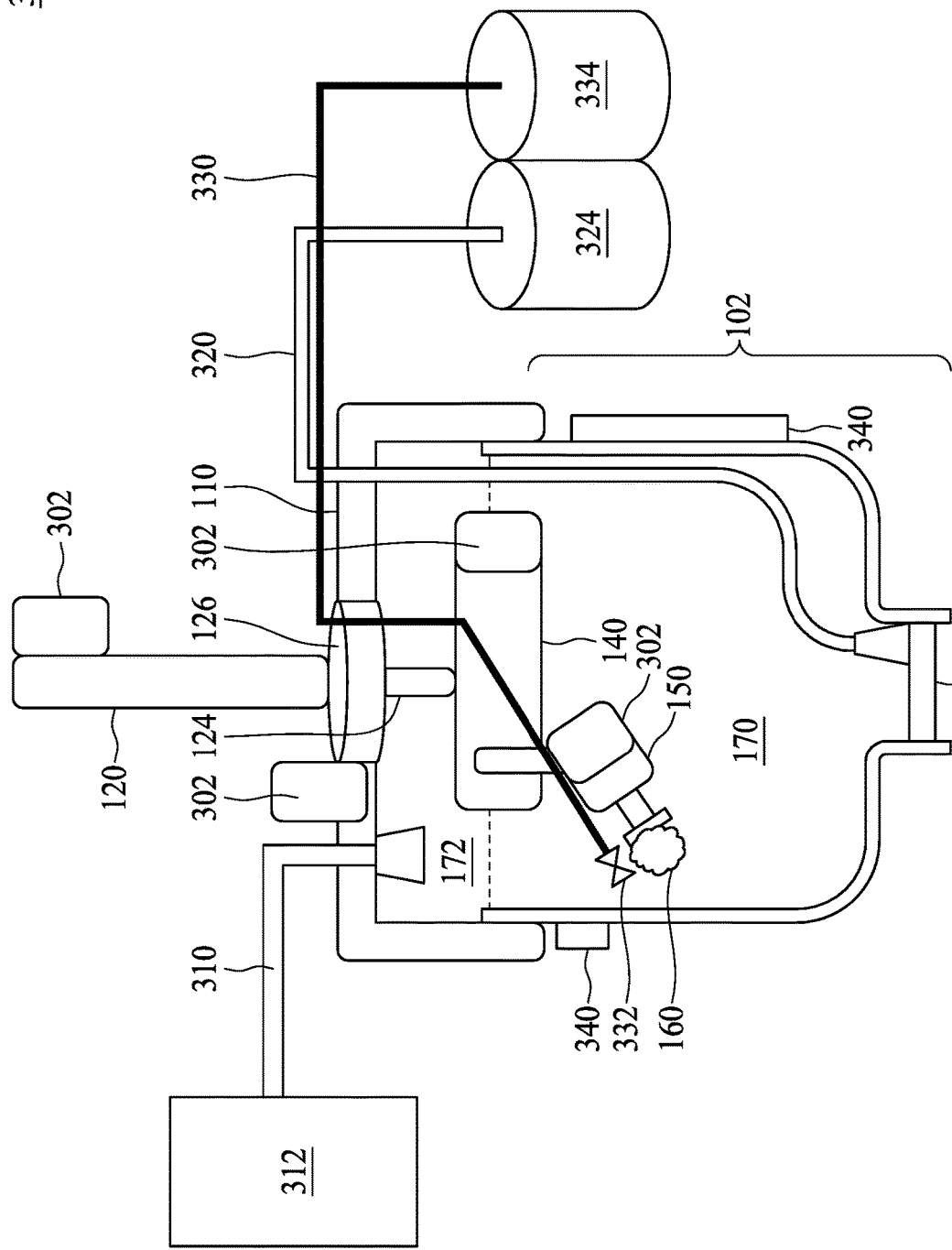
FIG. 3 is a schematic diagram illustrating a cleaning apparatus for a semiconductor equipment in accordance with some embodiments.

FIG. 3 is a schematic diagram illustrating a cleaning apparatus 300 for the semiconductor equipment 102 in accordance with some embodiments. The like numerals shown in FIG. 3 as well as other figures indicate similar structures, materials and functionalities of the elements which the numerals refer to. The cleaning apparatus 300 is disposed over the semiconductor equipment 102. The cleaning apparatus 300 includes a casing 110, a cylinder 120, a rail 140, an arm 150 and a cleaning head 160. The details of the abovementioned features have been provided above and are omitted here for simplicity.

In an embodiment, the cleaning apparatus 300 includes one or more driving members 302 coupled to each part of the robot, such as the cylinder 120 (or the movable shaft 124), the rotary unit 126, the rail 140 and arm 150. In an embodiment, each of the driving members 302 includes a motor or the like.

In an embodiment, the cleaning apparatus 300 further includes at least one baffle 340 disposed on lateral sides of the semiconductor equipment 102. The baffles 340 are configured to block the openings of the semiconductor equipment 102 in establishing a sealed space 172 and the sealed processing chamber 170. In an embodiment, the cleaning apparatus 300 includes a baffle 342 at the bottom of the semiconductor equipment 102 to block cleaning liquid or waste liquid from flowing out from the bottom of the processing chamber 170.

In an embodiment, the cleaning apparatus 300 further includes channels or tubes 310, 320 and 330 extending through vias of the casing 110 and transferring gas or liquid between the chamber 170 and the outside environment. The cleaning gas or liquid can be transported in various ways. In an embodiment, the tube 330 includes a first end connected to a tank 334, wherein the tube 330 extends through the sealed space 172 of the casing 110 and includes a second end 332 within the processing chamber 170. In an embodiment, the second end 332 of the tube 330 is disposed adjacent to the cleaning head 160 and is configured to work collaboratively with the robot (e.g., the support members comprised of the movable shaft 124, the rail 140, the connector 138, and arm 150 and the cleaning head 160) of the cleaning apparatus 300. In an embodiment, the tube 330 is configured to spray cleaning liquid towards a location on the chamber wall 106 close to the cleaning head 160.

In some embodiments, some exhaust gases or waste liquids are inevitably generated during or after the cleaning operation. It is desirable if such exhaust gas or waste liquid (some of which may be toxic) can be collected in an isolated manner during the cleaning operation. In an embodiment, the tube 310 includes a first end connected to a tank 312 and a second end extending in the sealed space 172 of the casing 110. In an embodiment, the tube 310 is configured to draw an exhaust gas, such as a volatile organic compound (VOC), generated and spread during the cleaning operation, out of the sealed space 172 and the chamber 170. In an embodiment, the tube 320 includes a first end connected to a tank 324 and a second end extending around a bottom of the chamber 170. In an embodiment, the tube 320 is configured to draw waste liquid, which accumulates at the bottom of the chamber 170, out of the chamber 170. In some embodiments, sealing materials, such as rubber, may be used to fill gaps between the casing 110 and the tubes (e.g., tubes 310, 320 and 330) and the baffles (e.g., baffles 340 and 342) for ensuring air and/or water tightness and preventing leakage of gas or liquid from the sealed space 172 or the processing chamber 170.

According to an embodiment, an apparatus is provided. The apparatus includes a first support member coupled to a casing and constructed to move along a first axis through the casing and rotate around the first axis, a second support member coupled to the first support member and constructed to move along a second axis perpendicular to the first axis, and an arm pivotally coupled to the second support member and constructed to rotate around a third axis perpendicular to the first axis and the second axis. The apparatus also includes a cleaning head attached to the arm and constructed to rotate around a longitudinal axis of the arm.

According to an embodiment, an apparatus includes a casing, a first shaft extending though the casing and constructed to move along a first axis and rotate around the first axis, a rail coupled to the first shaft and constructed to move along a second axis, an arm pivotally coupled to the rail and constructed to rotate around a third axis, and a cleaning head attached to the arm and constructed to move along a longitudinal axis of the arm.

According to an embodiment, an apparatus includes a casing, including a first plate and a second plate opposite to the first plate and constructed to supply a liquid. The apparatus also includes a shaft constructed to move along a first axis though the first plate and to rotate around the first axis, a rail coupled to the shaft and constructed to move along a second axis parallel to a surface of the first plate, an arm pivotally coupled to the rail, and a cleaning head attached to the arm and constructed to rotate around a longitudinal axis of the arm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus, comprising:
a casing configured to be detachably mounted on a workpiece, wherein the casing is configured to cover an entirety of a first opening of the workpiece, and wherein the casing comprises a second opening configured to expose a portion of the workpiece during a cleaning operation;
a first support member coupled to the casing and constructed to move along a first axis through the casing and rotate around the first axis;
a second support member coupled to the first support member and constructed to move along a second axis perpendicular to the first axis;
an arm pivotally coupled to the second support member and constructed to rotate around a third axis perpendicular to the first axis and the second axis; and
a cleaning head attached to the arm and constructed to rotate around a longitudinal axis of the arm,
wherein the casing comprises a first plate and a second plate opposite to the first plate, the second opening is defined by the second plate, wherein the cleaning head is coupled to the first plate through the first support member, the second support member and the arm and extends outside the casing through the second opening.

2. The apparatus according to claim 1, wherein the second opening is further arranged to allow the first support member and the second support member to traverse therethrough.

3. The apparatus according to claim 2, wherein the casing further comprises a side plate connecting the first plate to the second plate and constructed to form a sealed space, including the second opening, in conjunction with the first plate, the second plate and the workpiece.

4. The apparatus according to claim 2, wherein the casing further comprises vias on a surface of the second plate facing the workpiece and constructed to supply a liquid.

5. The apparatus according to claim 4, wherein the second plate comprises a channel coupled to the vias and constructed to transport the liquid.

6. The apparatus according to claim 4, further comprising a tube coupling to the second plate and constructed to dispense the liquid to the workpiece through the vias.

7. The apparatus according to claim 2, wherein the first support member comprises a cylinder mounted on the casing and comprising a shaft constructed to move in the cylinder along the first axis and rotate around the first axis.

8. The apparatus according to claim 7, wherein the first support member further comprises a driving member constructed to drive the shaft.

9. The apparatus according to claim 1, wherein the second support member comprises a rail and a connector pivotally coupled to the arm and constructed to move on the rail.

10. The apparatus according to claim 1, wherein the cleaning head is further constructed to move along the longitudinal axis of the arm.

11. An apparatus, comprising:
a casing configured to be detachably mounted on a processing chamber, wherein the casing covers an entirety of a first opening of the processing chamber;
a first shaft extending though the casing and constructed to move along a first axis and rotate around the first axis;
a rail coupled to the first shaft and constructed to move along a second axis;
an arm pivotally coupled to the rail and constructed to rotate around a third axis; and a cleaning head attached to the arm and constructed to move along a longitudinal axis of the arm, wherein the apparatus is configured to form a sealed space with a chamber wall of the processing chamber and clean the chamber wall during a cleaning operation, wherein the casing comprises a first plate and a second plate opposite to the first plate, the second plate defining a second opening in communication with the first opening, wherein the cleaning head is coupled to the first plate through the first shaft, the rail and the arm and extends outside the casing through the second opening.

12. The apparatus according to claim 11, wherein the arm comprises a driving member and a first sleeve fastened to the driving member, the driving member being constructed to rotate the first sleeve around the longitudinal axis of the arm.

13. The apparatus according to claim 12, wherein the first sleeve comprises a hole formed on a surface facing the cleaning head, the hole comprising a polygonal shape when seen from a cross-sectional view.

14. The apparatus according to claim 13, wherein the cleaning head comprises a second sleeve and a second shaft extending through the second sleeve, the second shaft comprising the polygonal shape when viewed from a cross-sectional view and constructed to move in the hole of the first sleeve of the arm.

15. The apparatus according to claim 14, wherein the cleaning head further comprises a spring wrapping around the second shaft.

16. The apparatus according to claim 14, wherein the cleaning head further comprises a holding member constructed to allow the second shaft to movably couple to the second sleeve.

17. The apparatus according to claim 11, further comprising a baffle disposed on a side of the processing chamber constructed to seal a second opening of the processing chamber.

18. An apparatus, comprising:
a casing configured to be detachably mounted on a processing chamber and comprising:
a first plate; and
a second plate opposite to the first plate and constructed to supply a liquid, the second plate defining a first opening configured to face a second opening of the processing chamber;
a shaft constructed to move along a first axis though the first plate and to rotate around the first axis;
a rail coupled to the shaft and constructed to move along a second axis parallel to a surface of the first plate;
an arm pivotally coupled to the rail; and
a cleaning head attached to the arm and constructed to rotate around a longitudinal axis of the arm, wherein, during a cleaning operation, the cleaning head extends freely through the first opening and the second opening and reaches a chamber wall of the processing chamber,
wherein the cleaning head is coupled to the first plate through the shaft, the rail and the arm and extends outside the casing through the first opening.

19. The apparatus according to claim 18, wherein the casing further comprises a channel constructed to remove exhaust gas or water.

20. The apparatus according to claim 18, wherein the casing further comprises a side plate coupled to the first plate and the second plate and substantially aligned with an outer sidewall of a workpiece.

* * * * *